US011803328B2

(12) United States Patent
Ware

(10) Patent No.: US 11,803,328 B2
(45) Date of Patent: Oct. 31, 2023

(54) MEMORY WITH VARIABLE ACCESS GRANULARITY

(71) Applicant: Rambus Inc., San Jose, CA (US)

(72) Inventor: Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 51 days.

(21) Appl. No.: 17/428,105

(22) PCT Filed: Feb. 5, 2020

(86) PCT No.: PCT/US2020/016767
§ 371 (c)(1),
(2) Date: Aug. 3, 2021

(87) PCT Pub. No.: WO2020/167549
PCT Pub. Date: Aug. 20, 2020

(65) Prior Publication Data

US 2022/0027093 A1 Jan. 27, 2022

Related U.S. Application Data

(60) Provisional application No. 62/804,533, filed on Feb. 12, 2019.

(51) Int. Cl.
*G06F 3/06* (2006.01)
*G06F 13/16* (2006.01)
*G06F 13/42* (2006.01)

(52) U.S. Cl.
CPC .......... *G06F 3/0659* (2013.01); *G06F 3/0604* (2013.01); *G06F 3/0673* (2013.01); *G06F 13/1668* (2013.01); *G06F 13/4282* (2013.01)

(58) Field of Classification Search
CPC .... G06F 3/0659; G06F 3/0604; G06F 3/0673; G06F 13/1668; G06F 13/4282
See application file for complete search history.

(56) References Cited

U.S. PATENT DOCUMENTS 6,542,416 B1 4/2003 Hampel et al.
6,636,935 B1 10/2003 Ware et al.
(Continued)

OTHER PUBLICATIONS

Notification of Transmittal of the International Search Report and the Written Opinion of the International Searching Authority, or the Declaration with dated Apr. 23, 2020 re: Int'l Appln. No. PCT/US2020/016767. 19 pages.
(Continued)

*Primary Examiner* — Idriss N Alrobaye
*Assistant Examiner* — Richard B Franklin
(74) *Attorney, Agent, or Firm* — Charles Shemwell

(57) ABSTRACT

An integrated-circuit memory component receives, as part of respective first and second memory read transactions, a first column access command that identifies a first volume of data and a second column read command that identifies a second volume of data, the second volume of data being constituted by not more than half as many data bits as the first volume of data. In response to receiving the first column access command, the integrated-circuit memory component transmits the first volume of data as N parallel bit-serial data signals over N external signaling links. In response to receiving the second column access command, the integrated-circuit memory component transmits the second volume of data as M parallel bit-serial data signals over M of the N external signaling links, where M is less than N.

21 Claims, 7 Drawing Sheets

(56) References Cited

U.S. PATENT DOCUMENTS 6,889,304 B2 5/2005 Perego et al.
7,280,428 B2 10/2007 Ware et al.
7,420,874 B2 9/2008 Kasamsetty et al.
7,480,776 B2 * 1/2009 Sohn .................... G11C 7/1084 365/189.011
7,500,075 B1 3/2009 Garrett, Jr.
7,610,417 B2 10/2009 Shaeffer
7,613,883 B2 * 11/2009 Bellows ............... G11C 7/1066 711/167
7,660,183 B2 2/2010 Ware et al.
7,769,942 B2 8/2010 Ware et al.
8,028,144 B2 9/2011 Hampel et al.
8,069,379 B2 11/2011 Perego et al.
8,190,808 B2 5/2012 Lai et al.
8,380,943 B2 2/2013 Shaeffer
8,595,459 B2 11/2013 Ware et al.
8,762,657 B2 6/2014 Vaidyanath et al.
9,025,409 B2 5/2015 Shaeffer
9,117,496 B2 8/2015 Shaeffer et al.
9,152,585 B2 10/2015 Ware
9,165,639 B2 10/2015 Ware et al.
9,208,836 B1 12/2015 Ware
9,275,699 B2 3/2016 Gopalakrishnan et al.
9,778,877 B1 10/2017 Ware
9,837,132 B2 12/2017 Ware et al.
9,916,873 B2 3/2018 Giovannini et al.
2010/0077267 A1 3/2010 Perego et al.
2010/0211748 A1 8/2010 Perego et al.
2014/0068169 A1 3/2014 Ware et al.
2017/0315953 A1 11/2017 Ware
2017/0337014 A1 11/2017 Ware et al.
2017/0337144 A1 11/2017 Ware et al.
2017/0344275 A1 11/2017 Ware et al.
2017/0351627 A1 12/2017 Ware et al.
2018/0053544 A1 2/2018 Ware et al.
2018/0081833 A1 3/2018 Giovannini et al.
2018/0108387 A1 4/2018 Ware
2018/0137067 A1 5/2018 Ware et al.

OTHER PUBLICATIONS

EP Extended European Search Report with dated Oct. 19, 2022 re: EP Appln. No. 20756414.7. 9 pages.

EP Response filed May 11, 2022 in Response to the Extended European Search Report dated Oct. 19, 2022 and the Communication Pursuant to Rules 70(2) and 70a(2) EPC dated Nov. 8, 2022 re: EP Appln. No. 20756414.7. 22 pages.

* cited by examiner

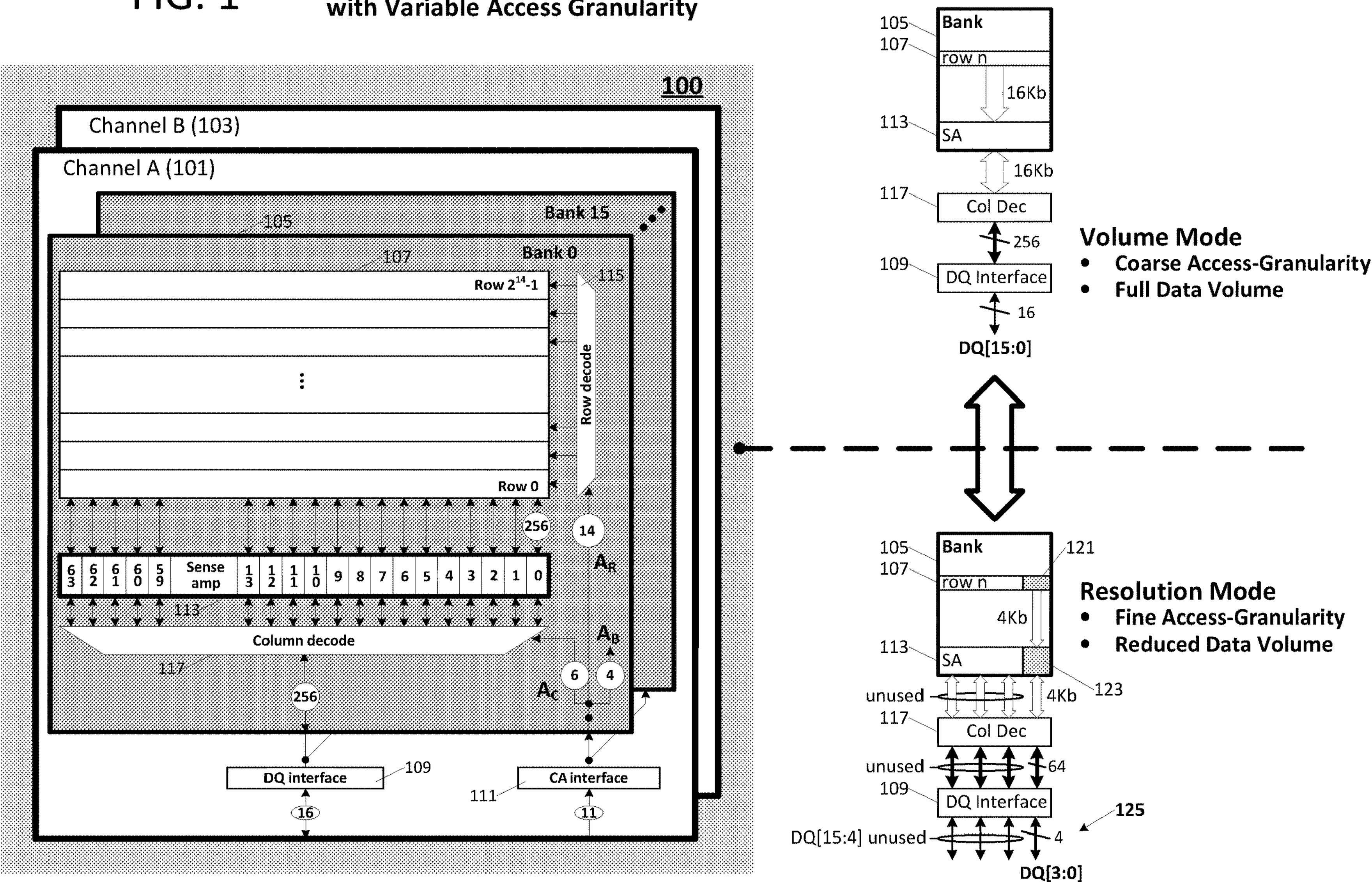
FIG. 1
Dual Channel Memory Component
with Variable Access Granularity
100
Channel B (103)
Channel A (101)
Bank 15
105
Bank 0
107
Row $2^{14}$-1
115
Row decode
Row 0
256
14
$A_R$
6 3
6 2
6 1
6 0
5 9
Sense amp
1 3
1 2
1 1
1 0
9
8
7
6
5
4
3
2
1
0
113
Column decode
$A_B$
117
6
4
$A_C$
256
DQ interface
109
CA interface
111
16
11
Bank
105
107
row n
16Kb
113
SA
16Kb
117
Col Dec
256
Volume Mode
• Coarse Access-Granularity
• Full Data Volume
109
DQ Interface
16
DQ[15:0]
Bank
105
107
row n
121
Resolution Mode
4Kb
• Fine Access-Granularity
• Reduced Data Volume
113
SA
123
unused
4Kb
117
Col Dec
unused
64
109
DQ Interface
125
DQ[15:4] unused
4
DQ[3:0]

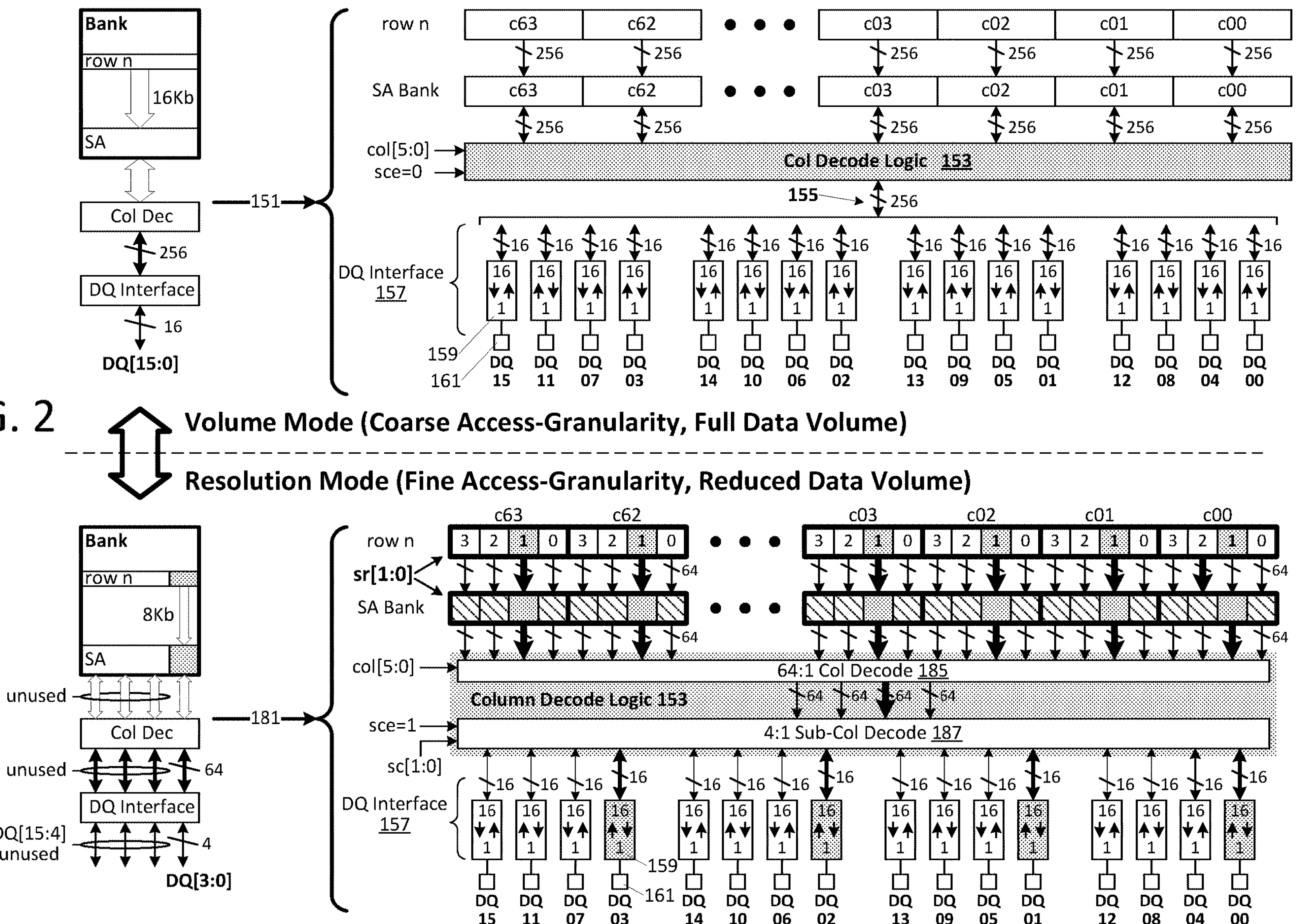
FIG. 2
Volume Mode (Coarse Access-Granularity, Full Data Volume)
Resolution Mode (Fine Access-Granularity, Reduced Data Volume)
Bank
row n
16Kb
SA
Col Dec
256
DQ Interface
16
DQ[15:0]
151
row n
SA Bank
c63
c62
c03
c02
c01
c00
col[5:0]
sce=0
Col Decode Logic 153
155
DQ Interface 157
159
161
DQ 15
DQ 11
DQ 07
DQ 03
DQ 14
DQ 10
DQ 06
DQ 02
DQ 13
DQ 09
DQ 05
DQ 01
DQ 12
DQ 08
DQ 04
DQ 00
Bank
row n
8Kb
SA
unused
Col Dec
unused
64
DQ Interface
DQ[15:4] unused
4
DQ[3:0]
181
sr[1:0]
col[5:0]
64:1 Col Decode 185
Column Decode Logic 153
sce=1
sc[1:0]
4:1 Sub-Col Decode 187

Bank
row n
16Kb
SA
Col Dec
256
Ser/Des
16
DQ[15:0]
$t_{RC}$~$64t_{CK}$~32ns
$t_{RRD}$~$4t_{CK}$~2ns
$t_{DCK}$~0.125ns
DCK
CA
DQ
ACT
10b
305
RD
307
311
309
64B
313
16b
No bank interference
$t_{CA}$~$1t_{CK}$~0.5ns
$t_{RCD}$~$37t_{CK}$~18.5ns
$t_{RL}$~$16t_{CK}$~8ns
$t_{DQ-64B}$~$16t_{DCK}$~2ns
Volume Mode (Coarse Access-Granularity, Full Data Volume)
Resolution Mode (Fine Access-Granularity, Reduced Data Volume)
8Kb
unused
64
4
DQ[3:0]
11b
325
327
331
329
16B
333
4b
$t_{DQ-16B}$~$16t_{DCK}$~2ns Memory Channel 365
367
mat 369
512b
512b
32 mat
32 mat
Row logic of mat enabled by sub-row (SR) address field
Column logic of mat enabled by sub-column (SC) address field
$EN_{SR}[3:0]$
$EN_{SC}[3:0]$
[3]
[2]
[1]
[0]
Bank [15]
Bank [14]
Bank [i]
Bank [1]
Bank [0]
256
16
Global column IO
4:1 column steering
DQ[15:0] interface w/ 16:1 serialization EN_SR[3]
EN_SR[2]
EN_SR[1]
EN_SR[0]
Sub-row enable
411
Row address
Row decode
415
417
Sub-row enable for sense amp
MAT 401
Sub-column enable
Column address
Column data
EN_SC[0]
EN_SC[1]
EN_SC[2]
EN_SC[3]
425
Column decode
420
403
405
407
421
423
Sense amp
Column I/O 427

450
471
Bank 15
Bank 0
Row $2^{14}$-1
Row 0
Row decode
256
14
6 3
6 2
Sense amp
3
2
1
0
$A_R$
$A_C$
$A_B$
Column decode
6
4
451
DQ interface
CA interface
4
12
455
Chan Mux
Channel A
Channel B
$t_{RC}$~$64t_{CK}$~32ns
$t_{RRD}$~$4t_{CK}$~2ns
$t_{DCK}$~0.125ns
DCK
CA
DQ
ACT
RD
8B
4b
$t_{CA}$~$1t_{CK}$
$t_{RCD}$~$37t_{CK}$~18.5ns
$t_{RL}$~$16t_{CK}$~8ns
$t_{DQ-8B}$~$8t_{DCK}$~1ns
No bank interference

MEMORY WITH VARIABLE ACCESS GRANULARITY

TECHNICAL FIELD

The present disclosure relates generally to data processing and more particularly to memory systems and components thereof.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a dual-channel memory component that may be accessed with either of at least two transaction modes having different access granularities;

FIG. 2 illustrates more detail regarding the transition between volume and resolution operating modes;

DETAILED DESCRIPTION

Figures 3, 4, 5:
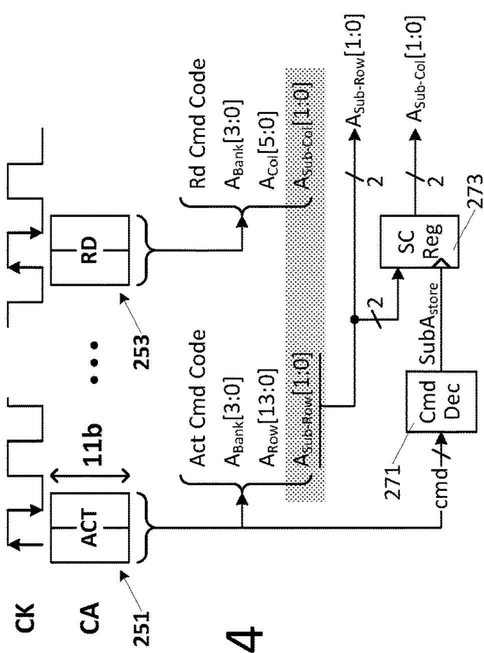
FIG. 3 illustrates an embodiment of a sub-column decoder that may be used to implement the sub-column decoder shown in FIG. 2.
FIG. 4 illustrates exemplary row and column command packets that may be used to specify sub-row activation and sub-column access, respectively, during resolution-mode access.
FIG. 5 illustrates an exemplary configuration register that may be programmed in response to memory controller instructions and configuration data to configure operating modes of a variable access-granularity memory component.

In various embodiments herein memory controllers and memory components exchange data with varying granularity in accordance with programmed settings and/or granularity-specifying commands. In a number of embodiments, memory components having a native read/write data transfer granularity include circuitry to support fractional data transfer (i.e., transfer of a data volume that is a fraction of the native-size data volume) and thereby enable improved access efficiency (e.g., higher access-energy/bit) in applications that require access to relatively small, diversely located data volumes. In yet other embodiments, two or more groups of memory banks otherwise accessed via respective/separate memory channels are accessed via a shared channel—in effect, logically merging the otherwise separate groups of memory banks into a larger unified group and thus correspondingly lowering the volume of data that must be retrieved in each memory bank access to maintain peak data throughput. These and other features and embodiments are discussed in greater detail below.

FIG. 1 illustrates an embodiment of a dual-channel memory component 100 that may be accessed with either of at least two transaction modes having different access granularities: volume-mode access with relatively coarse, native granularity and resolution-mode access with relatively fine (smaller volume of data) granularity. In the depicted example, memory component 100 includes two identically implemented and independently operable/configurable memory channels 101 and 103 (channels A and B, respectively, which may be, in essence, two memory components implemented in a single integrated circuit die or in respective dies of a multi-die integrated circuit package) so that transactions depicted with, for example, channel A are equally applicable to channel B. In other embodiments, particularly where the two memory channels are operable in a merged mode (i.e., to increase effective bank count and thus reduce data transfer granularity required in sequential bank accesses to maintain peak data throughput), memory channels 101 and 103 may be divergently implemented.

In the FIG. 1 example, each memory channel 101, 103 includes 16 memory banks 105, $2^{14}$ rows (107) of memory cells per bank, $2^6$ columns of memory cells per row, $2^8$ memory cells per column and a bidirectional 16-bit data signaling interface 109. During volume-mode data transfer, data signaling interface 109 ("data interface" or "DQ interface") outputs/receives 16 bits simultaneously (in parallel) via 16 external data links (DQ) during each half-cycle of a data clock signal, DCK, and may thus output/receive an entire 256-bit column of data over an 8 DCK-cycle "burst interval"—two bits per DCK cycle per link times 8 DCK cycles times 16 DQ links.

A command interface 111 samples command/address (CA) bits conveyed on a CA signaling path in response to successive rising/falling or falling/rising edges of a system clock signal (CK) and thus receives, in the 11-bit-wide example shown, one 22-bit command/address packet per CK cycle. In the FIG. 1 embodiment, the system clock period is four times the data clock period ($t_{CK}=4t_{DCK}$), so that two command/address packets may be received per $8t_{DCK}$ volume-mode data burst interval.

The memory cells that constitute storage rows 107 are single-bit dynamic random access memory cells accessed in two phases—a row activation phase (responsive to a row-activation CA packet) in which the data stored within an address-specified row of memory cells or "page of data" is transferred to a sense amplifier bank 113, and a column-access phase (responsive to a column-access CA packet) in which an address-selected column of data within sense amplifier bank 113 is output via data signaling interface 109 (a column read operation, outputting "read" data) or overwritten with a like-volume of "write" data received via data signaling interface 109. As the page of data remains resident and accessible within sense amplifier bank 113 (or "page buffer") until the sense amplifier bank is precharged (i.e., flushed or "unlatched" in preparation for a subsequent row activation), multiple column-access operations may be carried out per row-activation, leveraging spatial and temporal locality principles.

All of the foregoing implementation details—bank, row and column quantities, data and CA interface sizes, data burst size, CA packet size, relative data and system clock rates, etc.—and those discussed below in regard to resource timing constraints, clock frequencies, time intervals, etc. are presented herein for purposes of example only. Any or all of these implementation details may vary in alternative embodiments. Also, while memory component 100 (and alternative embodiments discussed below) is assumed herein to have a DRAM core, various other core storage technologies (e.g., flash memory, static random access memory, phase-change memory, magneto-resistive memory, etc.) may be deployed instead of or in addition to DRAM in alternative variable-access granularity memory embodiments.

Still referring to FIG. 1, system and data clock frequencies in relation to various resource timing constraints imply control sequences for sustained peak data throughput (i.e., maximum memory bandwidth). For example, repeated row activation operations directed to the same memory bank are constrained by a row cycle time ($t_{RC}$) which, assuming best-case round-robin bank access, implies a per-activation data transfer interval of $t_{RC}$ divided by the bank count. In 16-bank memory channel 101, for example, a 32nS $t_{RC}$ interval leaves 2nS for data readout from each memory bank and thus, assuming a 0.125nS $t_{DCK}$ (data clock period) and double-data-rate transfer of two bits per link per $t_{DCK}$, provides time for two 16-bit data transfers on each DQ link per bank; time for two 256-bit data transfers over 16-bit-wide data interface 109 and thus an average of two column access operations per bank (i.e., per open page (activated row) within that bank). Said another way, peak data throughput with balanced bank access (i.e., no idle time on DQ links and accessing all banks at essentially the same rate) requires 512 bits (64 bytes (64B)) of data to be transferred to/from a given memory channel per row activation—that is, a 64-byte data granularity per row activation and a 32-byte data granularity per column read/write operation.

Still referring to FIG. 1, volume-mode operation reflects the relatively coarse access granularity described above with a full 32-byte data volume (64-byte per row activation, 32-byte per column access) transferred per column access and, on average, a 64-byte volume transferred per row activation (two column operations per row activation). In applications that require relatively frequent access to smaller, less localized units of data (i.e., smaller quantities of data likely to be dispersed among different rows of a given memory bank), the coarse volume-mode access granularity inflicts a significant energy/bit penalty as the predominant (or at least substantial) share of read/write data are needlessly retrieved (memory read) or overwritten (write). In those cases, memory component 100 or either or both memory channels thereof may be transitioned to resolution-mode—either on the fly in response to incoming commands or programmatically in response to register settings—to enable finer-granularity data access and thus avoid wasteful retrieval and re-write of un-needed data. In the particular embodiment shown, resolution-mode data access is scaled in both the row activation and column access operations, reducing the volume of activated data (and thus the effective data page size) by a factor of four as shown at 121 (e.g., from 16 Kb to 4 Kb) and also reducing the column read/write data access by a factor of four as shown at 123 (e.g., from 256 bits to 64 bits). These 4:1 scaling factors are carried forward in a number of embodiments described herein—in all cases, larger or smaller granularity scaling factors may apply and memory components and control components may support multiple mode-programmed and/or command-specified scaling factors. In the FIG. 1 embodiment, the resolution-mode column data volume is reduced, in part, though width-scaling of the data interface 109 as shown at 125 (i.e., by a factor of four in the depicted example). Where the transition between volume and resolution modes is carried out dynamically (i.e., on the fly through command code, for example), a proportional number of the signaling links and corresponding signaling circuits within the DQ interface are unused/disabled—12 out of 16 links and signaling circuits in the 4:1 volume reduction example shown.

FIG. 2 illustrates more detail regarding the transition between volume and resolution operating modes. In the depicted example, a sub-column enable signal (sce) is deasserted during volume-mode memory access (sce=0) and asserted during resolution-mode access (sce=1). Referring first to the volume-mode detail at 151, a complete row of data (row 'n' containing $2^6$ columns of $2^8$ data cells and thus $2^{14}$ data bits) is transferred to a sense amplifier bank (SA Bank) during a row activation, followed by selection of a single 256-bit column of data in a column access operation. More specifically, column-decode logic 153 performs a 64:1 multiplexing operation, transferring an entire 256-bit column of data between a selected one of 64 sense-amplifier groups (c00-c63) and 256 column input/output (I/O) lines 155, with data being multiplexed from the selected sense-amplifier group onto column I/O lines 155 in a column-read operation and demultiplexed from column I/O lines 155 into the selected sense-amplifier group in a column write operation. Within data interface 157 Each of sixteen 16-bit sub-groups of the column I/O lines is coupled to a respective serializer/deserializer circuit 159 which serializes outbound (read) data for transmission as a stream of sixteen sequential bits via a corresponding DQ pad 161 (and external DQ signaling link) and, conversely, deserializes an inbound stream of 16 write data bits (i.e., arriving via the corresponding DQ link/DQ pad) into a parallel 16-bit value on the subject column I/O lines.

Turning now to the resolution-mode operation shown at 181, a two-bit sub-row address "sr[1:0]" is applied during a row activation operation to more finely resolve the activated memory cells to one of four sub-rows within the row-address-specified row. In one embodiment, for example, the sub-row address is applied (i) in combination with the row address to select (and enable data transfer from) one of four sub-rows of memory cells within a row-address-specified row of memory cells, and (ii) to the sense amplifier bank (SA Bank) to enable data latching within one of four groups of sense amplifiers (one of four "sub-pages") that corresponds to the sub-row selected for data transfer. By this operation, contents of the three unselected sub-rows of memory cells are not disturbed and the three unselected sub-pages within the sense-amplifier bank remain armed and need not be precharged—a "sub-row activation" that substantially reduces energy consumption otherwise expended to activate the full row of memory cells.

In one embodiment, the sub-row organization is layered over the column organization within the memory cell array so that, activation of a given sub-row constitutes activation of a corresponding fraction (e.g., one of four) of each column of data within the address-selected memory row. Referring still to FIG. 2, for example, resolution-mode activation results in activation of cell group 0, 1, 2 or 3 within each of the 64 columns of memory cells within the subject memory row (activation of cell group 1 is illustrated by shading) and transfer of the contents of the activated cell group within each column to a corresponding group of sense amplifiers. As any one of four cell groups may be activated in each of the columns (in accordance with sub-row address sr[1:0]), data from the activated cell group is referred to herein as a "sub-column" of data—in this case a total of 64 bits (one-fourth of the 256-bit volume-mode column of data).

Because sense amplifiers corresponding to unselected sub-columns in a sub-row activation remain unlatched (armed for subsequent activation), column access following sub-row activation is constrained to the activated data sub-columns. Accordingly, the sub-column address value (sc[1:

0]) supplied to resolve the column decode to a specific one of the 64 activated data sub-columns has a one-to-one correspondence with (e.g., matches or uniquely maps to) the sub-row address value. As discussed below, this correspondence has implications for sub-column address sourcing, enabling the sub-column address to be derived within the memory component from the sub-row address (e.g., a copy of the sub-row address is stored in conjunction with sub-row activation and subsequently supplied to the column decode logic 153 as the sub-column address value) or supplied by the memory control component with the requisite correspondence to the sub-row activation. In either case, when the sub-column enable signal is asserted (sce=1), the sub-column address is applied within sub-column decoder 187 (i.e., within the column decode logic 153) to enable a 4:1 decode of the full 256-bit column of data output by 64:1 column decoder 185. In the depicted example, the 64-bit data sub-column (i.e., sub-column '1') within the column-address-selected data column is passed to the four enabled I/O circuits 159 within DQ interface 157. Those enabled I/O circuits (i.e., shaded instances) output respective 16-bit portions of the 64-bit data sub-column as serial bit streams via respective DQ pads 161 (i.e., pads labeled DQ0, DQ1, DQ2 and DQ3 in the depicted example).

FIG. 3 illustrates an embodiment of a 4:1 sub-column decoder 201 that may be used to implement sub-column decoder 187 of FIG. 2. As shown, selector circuits 203 are coupled between respective groups of column I/O lines 155 and data I/O circuits 159—in this example, four selector circuits with each selector 203 coupled between a respective set of 64 column I/O lines (four groups of 16 column I/O lines per selector) and one of the four I/O circuits 159 coupled to pads DQ0-DQ3. Referring to detail view 209 of selector circuit 203 (the other selector circuits may be identically implemented), the sub-column enable signal (sce) is ANDed with sub-column address bits sc[0] and sc[1] in gates 211 and 213, respectively, to deliver a two-bit select signal 214 to multiplexer 215, which, in response, switchably couples one of the four sets of 16 column I/O lines (within the total 64 column I/O lines coupled to the selector) to the 16 lines (217) extending between the selector and corresponding data I/O circuit. By this arrangement, when the sub-column enable signal is asserted, selector 203 couples one of the four sets of 16 column I/O lines to a corresponding one data I/O circuits 159 in accordance with the sub-column address, thereby routing sub-column read data to the data I/O circuit for bit-serial transmission on the corresponding signaling link and routing sub-column write data received/parallelized by the data I/O circuit to the sub-column-address-specified portion of the data sub-page (i.e., to overwrite data within the sense amplifiers that contain the data sub-page). When the sub-column enable signal is deasserted (e.g., logic low), select signal 214 is driven low (i.e., '00' by gates 211 and 213) to select the 16 column I/O lines that constitute, within a complete volume-mode access, the component of the 256 column I/O lines dedicated to the corresponding I/O circuit 159. As shown, the remaining three sets of 16 column I/O lines are coupled directly to the corresponding I/O circuits 159 to conduct read data thereto and conduct write data therefrom during volume-mode access.

FIG. 4 illustrates exemplary row and column command packets, 251 and 253, that may be used to specify sub-row activation and sub-column access, respectively, during resolution-mode access. In one embodiment, the command signaling interface is widened by one or more bits (e.g., from 10 bits to 11 bits as shown or 12 bits) relative to conventional implementations to convey the additional address bits that enable sub-row activation and sub-column decoding. In other embodiments, unused bits within a pre-existing command packet protocol may be commandeered to convey the additional address bits, avoiding CA width-extension. In implementations that support command-differentiated volume-mode and resolution-mode operations (i.e., specifying between volume-mode and resolution-mode access through command encoding), increased CA interface width and/or unused bits within a pre-existing command protocol may provide headroom for such differentiation (additional command codes). For example, a memory control component may drive an otherwise unused bit within the row activation command packet (or additional bit delivered via interface-width increase) high or low to distinguish between resolution and volume-mode access.

Still referring to FIG. 4, each command/address packet (251 or 253) is sampled in response to two successive system clock edges (e.g., rising then falling or vice-versa) and thus, in the 11-bit CA interface-width example, encompass 22 command/address bits. Assuming the exemplary memory configuration shown in FIG. 1 ($2^4$ banks per channel, $2^{14}$ rows per bank, $2^6$ columns per row), each activate command packet 251 conveys a 1-bit or 2-bit activate command code, 4-bit bank address and 14-bit row address, together with a 2-bit sub-row address. Where a single bit is sufficient to encode the activate command (e.g., assertion of a predetermined bit within the command packet may suffice where activate commands constitute the only bank-specific row commands), the address and command bits total to 21 of the 22 available CA-packet bits and thus leave a spare bit that may be used to convey additional sub-row address or bank address information (e.g., indicating a merged-bank/channel operation as discussed below) or to differentiate between volume-mode and resolution-mode row activation.

In column command packet 253, a multi-bit column command code (specifying a column read in depicted example) is accompanied by a 4-bit bank address, 6-bit column address and 2-bit sub-column address. The relatively small address bit tally (12 bits as opposed to 20 bits in the row command packet) leaves space to encode a relatively large number of column commands (e.g., read and write commands differentiated with various precharge options and bit-masking options, for example) as well as one or more bits to specify whether a given read or write access is to be executed in volume mode or resolution mode.

As discussed above, sub-row and sub-column addresses may be identical (or have one-to-one correspondence) in resolution-mode accesses so that, in at least some embodiments, a sub-row address supplied in a resolution-mode row activation CA packet may be temporarily stored and then applied as the sub-column address value (or used to derive the sub-column address value) during an ensuing column access—an action that obviates conveyance of sub-column address bits within column CA packets, freeing up headroom for additional command differentiation or address information (including more resolute column-address information). This sub-row storage approach is illustrated conceptually in FIG. 4. As shown a command decoder 271 asserts a sub-address store signal in response to decoding a resolution-mode row-activation command (e.g., command 251), thereby strobing the accompanying sub-row address bits into a sub-column address register 273. When a resolution-mode column read or write command directed to the activated sub-row is received (e.g., command 253 sans the sub-column address bits), the contents of the sub-column address register 273 are applied to decode (select) the data sub-column.

FIG. 5 illustrates an exemplary configuration register 281 (e.g., configuration data storage, mode register, etc.) that may be programmed in response to memory controller instructions and configuration data to configure operating modes of a variable access-granularity memory component. In the depicted embodiment, configuration register 281 includes bit fields for programmatically selecting between volume-mode and resolution-mode operation (i.e., coarse-grained, full data volume per memory access vs. fine-grained partial data volume per memory access), for specifying the source of sub-column address information and for enabling or disabling bank-merged operation. In one implementation, specification of volume-mode operation (e.g., setting bit "V/R" to '0') within configuration register 281 enables command-based selection of resolution mode operations (i.e., command code indicates whether a given memory transaction is to be carried out in volume mode or resolution mode), while resolution-mode specification (V/R=1) triggers full-time resolution mode operation. In cases where the data links between the memory component and controller are limited to the resolution-mode data width (e.g., four DQ links in the examples of FIGS. 1-3), resolution-mode operation may be specified (i.e., programmed within register 281) at system initialization so that all memory access commands received thereafter (e.g., row activation, column read/write) are carried out with resolution-mode granularity, avoiding need to specify/differentiate resolution-mode operation in the command code. In alternative embodiments, particularly where the DQ link count accommodates volume-mode operation, on-the-fly granularity transition (i.e., command-based selection between volume-mode and resolution-mode operation) may be enabled in resolution mode rather than in volume mode (e.g., unless register 281 programmed for resolution mode, all memory access commands are carried out in volume-mode).

Still referring to FIG. 5, a sub-column-address (SCA) setting within configuration register 281 indicates the source of sub-column address bits to be applied during resolution-mode column read and write operations—re-applying sub-row address bits received in a preceding row-activation command (e.g., sub-row address bits stored as shown in FIG. 4) as sub-column address bits, or receiving sub-column address bits with individual column access commands. A channel-merge setting (CHM) within configuration register 281 indicates whether individual memory channels within the host memory component (e.g., channels A and B shown in FIG. 1) are to be separately operated (i.e., each as an N-bank memory device) or logically combined to double the effective bank count. In the latter case (double (2N) bank count), data written to or read from either of the two sets of N memory banks is transferred over a shared set of signaling links. In a number of embodiments, channel-merged (or bank-merged) mode is implemented in conjunction with resolution-mode operation to further reduce the per row-activation transaction granularity required for peak data throughput (i.e., as discussed below). Bank-merged mode may alternatively be implemented in conjunction with volume-mode operation to reduce the number of column access operations required per row activation without compromising data throughput.

Figure 6:
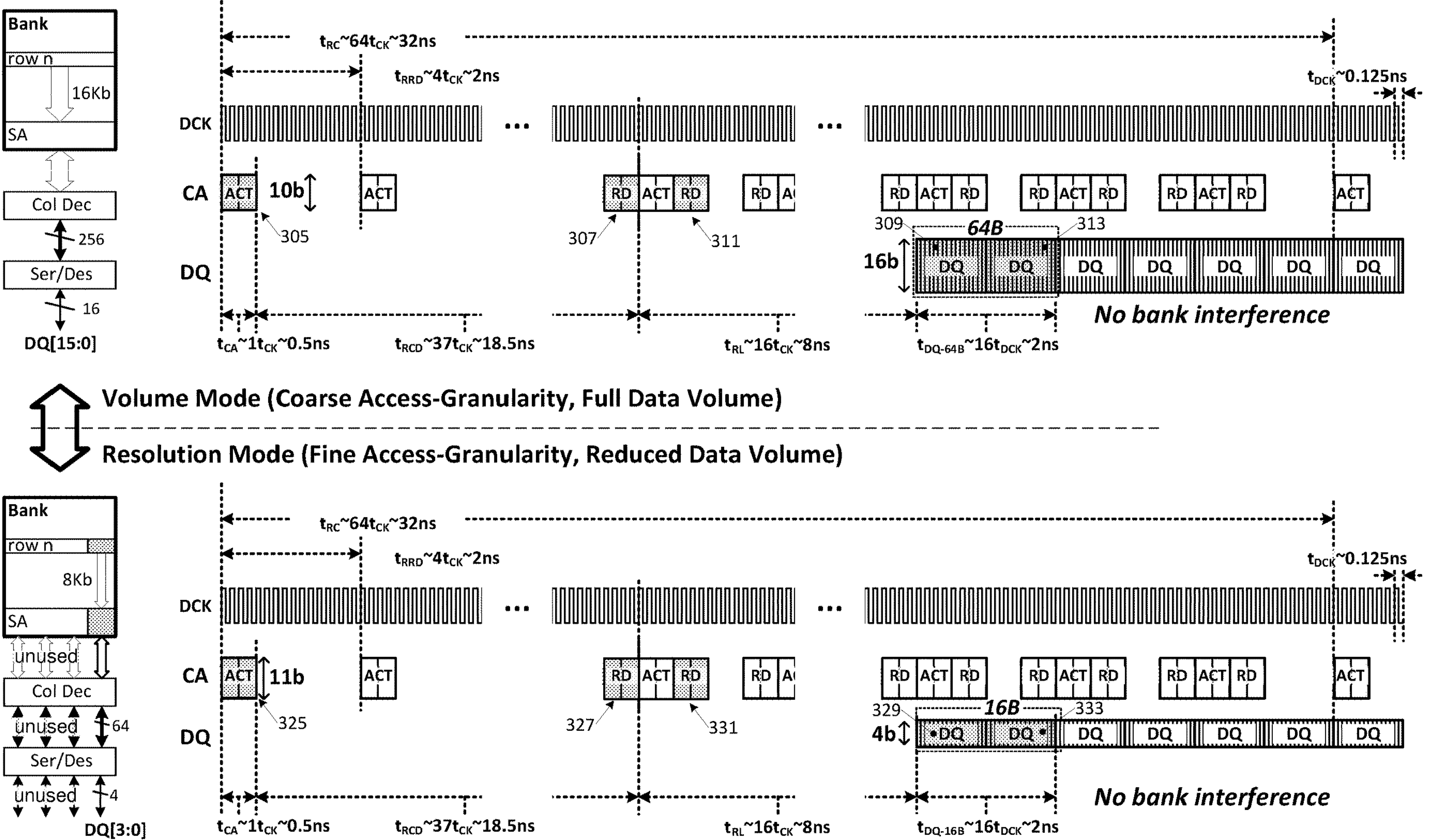
FIG. 6 illustrates an exemplary timing diagram contrasting the volume and resolution mode operations described in reference to FIGS. 1-4.

FIG. 6 illustrates an exemplary timing diagram contrasting the volume and resolution mode operations described in reference to FIGS. 1-4. In the example shown, CA packets are transmitted over a multi-link command/address path (CA) and sampled in response to rising and falling edges of a system clock signal (i.e., two samples per CA link per system clock cycle, $t_{CK}$), while data is conveyed over a multi-link data path (DQ) and sampled/transmitted in response to rising and falling edges of a data clock signal (i.e., two samples or bit transmissions per DQ link per $t_{DCK}$ interval). As discussed above and shown in FIG. 6, wider command/address packets may be conveyed on the command/address path in resolution mode than in volume mode (i.e., more bits transmitted in parallel and more specifically 11 bits instead of 10 in the example shown) to accommodate the additional sub-row and sub-column address bits and/or additional command-code bits needed to specify resolution-mode operation. In alternative embodiments, the command/address packet width may be uniform across the different granularity modes.

Referring to the exemplary volume-mode timing shown in FIG. 6, a row activation command received at 305 is followed a predetermined time later (i.e., RAS-to-CAS delay, $t_{RCD}$) by a column access command 307 directed to the activated row—a column read command in this example which itself triggers burst data output 309 via the DQ path after a predetermined read latency ($t_{RL}$). Note that like shading of activation command 305, read command 307 and data burst 309 indicates their correspondence to the same memory bank, while unshaded activation commands, read commands and data transmissions refer to transactions within other memory banks. Assuming the 32-byte volume-mode column access granularity discussed above, transmission of the data column over 16 DQ links consumes an 8 $t_{DCK}$ burst interval (16 bit intervals ($16t_{BIT}$) each having a 0.5 $t_{DCK}$ duration) and thus a 2 $t_{CK}$ interval—a 1 nS data burst interval assuming a 0.5nS $t_{CK}$ interval (0.125 ns $t_{DCK}$ interval). A 16-bank-per-channel arrangement having a 32 nS row cycle time ($t_{RC}$) constraint implies a 2nS data transfer window per row activation (i.e., for peak data throughput without resource conflict) and thus, on average, two column access operations per row activation. This transactional arrangement is shown by the activation command at 305, the two corresponding column read commands 307 and 311 and two back-to-back read data bursts at 309, 313—overall, a 64B data granularity per row activation.

In the resolution-mode operation, the same general timing applies (32nS $t_{RC}$, 0.5nS CA reception interval, 1nS column data burst), but with volumes of activated and transmitted/received data reduced by a factor of four. That is, instead of 32 byte column-access granularity and 64-byte average granularity per row activation 325, eight bytes are transferred (329, 331) per column access 327, 331(over four links instead of sixteen) and, on average 16 bytes per row activation.

Figure 7:
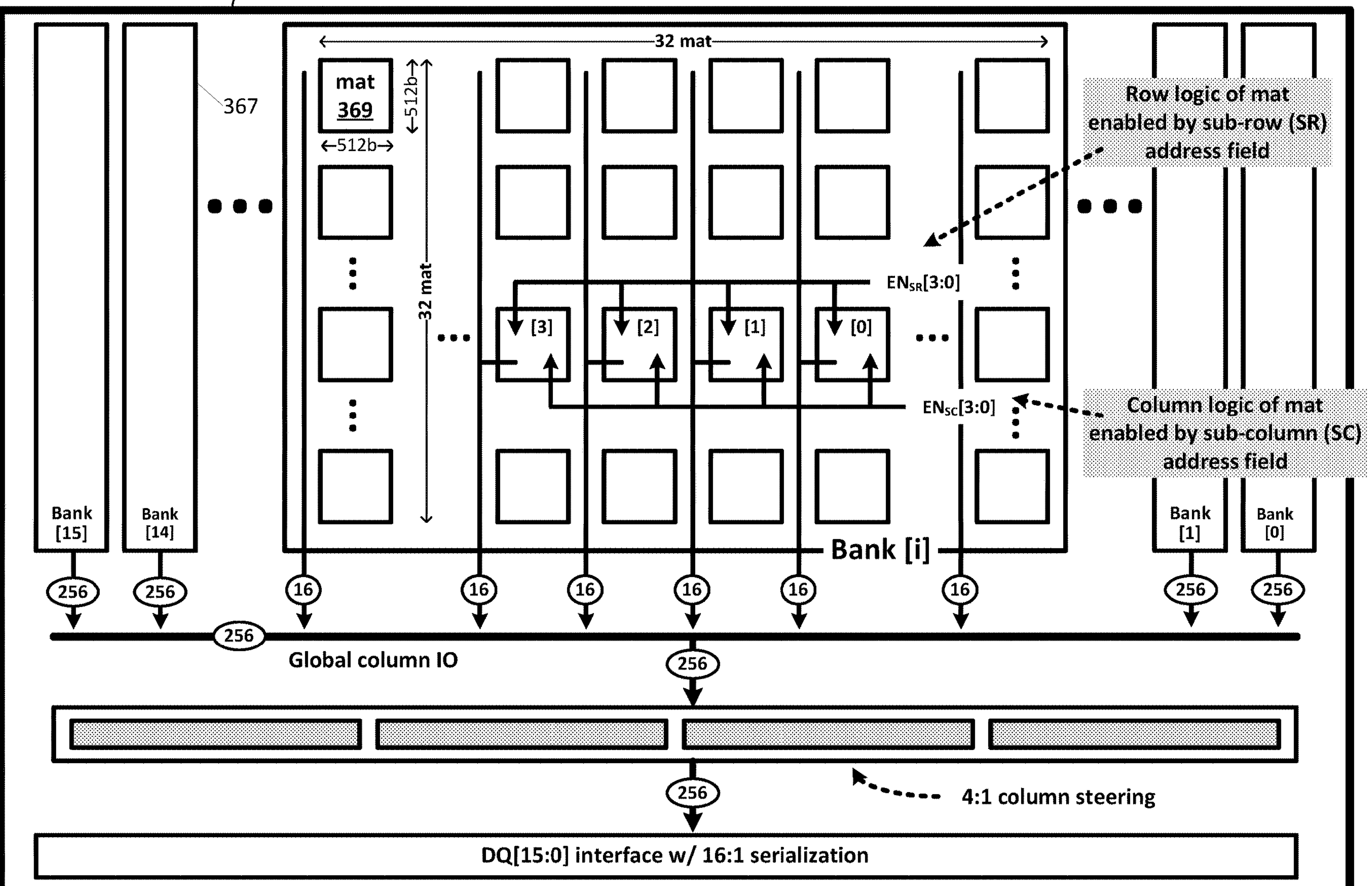
FIG. 7 illustrates an exemplary memory channel having memory banks organized in an array of memory mats.

FIG. 7 illustrates an exemplary memory channel 365 having memory banks 367 organized in an array of memory "mats" 369. More specifically, each 256 Mb bank ($2^{14}$ memory rows per bank, $2^{14}$ bits per memory row) is organized into 1024 (32 rows and 32 columns of) memory mats 369, with each mat including a 512b×512b cell array, a 512 bit sense amplifier bank, sub-row decode logic and sub-column decode logic. In the particular memory bank shown, a one-hot sub-row enable value, "$EN_{SR}[3:0]$," (e.g., one of four sub-row enable signals asserted in accordance with decode of a two-bit sub-row address value) is applied to each of 8 groups of four mats that span each row of the memory bank. By this arrangement, a resolution-mode memory transaction will enable row activation with one-fourth of the mats 369 within an address-selected row of mats (i.e., the row of mats that encompass the memory-cell row specified by the row address), with the activated mats being maximally offset from one another (i.e., every fourth mat activated) within the row. A one-hot sub-column enable value, "$EN_{SC}[3:0]$," (i.e., one of four sub-column enable signals asserted in accordance with decode of a two-bit sub-column address field) is likewise applied to each of the 8 groups of four mats that constitute the address-selected row of mats to enable column data output therefrom. For volume-mode access, all four sub-row enable signals and all four sub-column-enable signals are asserted to enable full-volume access (rather than fine-grained access) within the memory bank.

Figure 8:
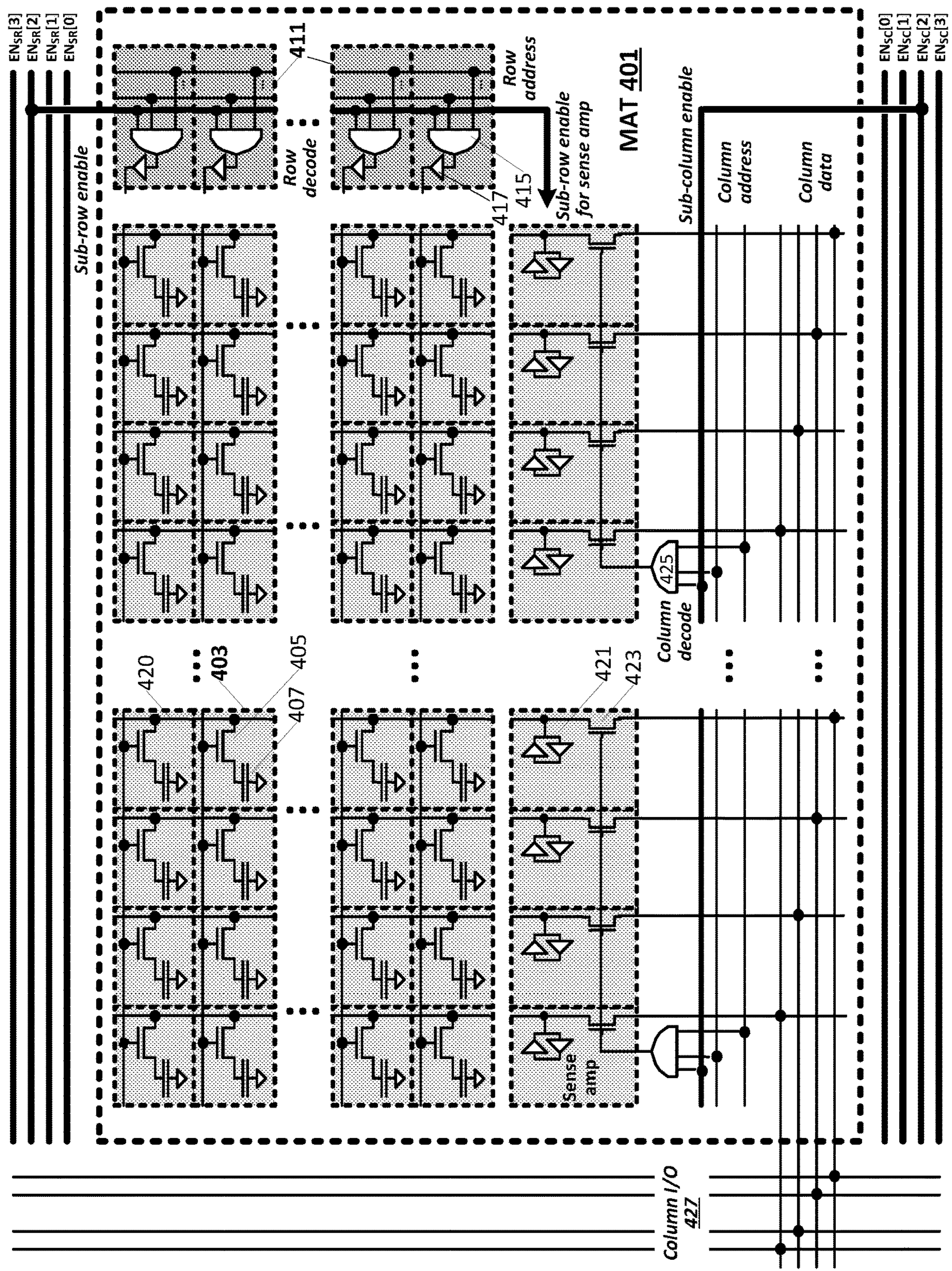
FIG. 8 illustrates a more detailed embodiment of a memory-cell mat that may be used to implement mats within the mat-based bank architecture of FIG. 7.

FIG. 8 illustrates a more detailed embodiment of a memory-cell mat 401 that may be used to implement mats 369 within the mat-based bank architecture shown in FIG. 7—in this case in the context of DRAM memory cells 403 each having an access transistor 405 and a capacitive storage element 407 though other core storage technologies may be used in alternative embodiments. As shown, one of the four decoded (one-hot) sub-row enable signals ($EN_{SR}[0]$-$EN_{SR}[3]$) is coupled to row-decode circuitry 411 within mat 401 (with the other three sub-row enable signals likewise coupled to row decode circuitry 411 within respective row-distributed mats) and applied to the row gating logic therein (depicted conceptually as a logic AND gate 415 and line driver 417). Accordingly, if the sub-row address supplied in a resolution-mode row activation corresponds to (i.e., is decoded to yield assertion of) the sub-row enable signal coupled to row decode circuitry 411 in memory-cell mat 401 and the row address also decodes to a row of cells within the mat, a word line within mat 401 coupled to gates of the access transistors 405 within the subject memory-cell row will be switched on, thereby enabling contents of the capacitive storage elements 407 to drive the column bit lines 420. As shown, the sub-row enable signal also enables operation of the sense amplifiers 421 within mat 401 (which operation is also conditioned on row address selection of a cell row within the mat) so that sense amplifiers are enabled within a fraction (one out of four) mats within a given row during row activation.

Still referring to FIG. 8, one of the four decoded sub-column enable signals ($EN_{SC}[0]$-$EN_{SC}[3]$) is coupled to the column decode logic (multiplexing logic) within the mat to enable selective data output from the sense amplifier bank via pass-gate transistors 423. More specifically, if the sub-column address supplied in a resolution-mode column access (including sub-row address captured for later application as sub-column selection) corresponds to the subject memory-cell mat and the row address also decodes to a row of cells within the mat, gates 425 will assert column-enable signals at the gates of transistors 423 thereby enabling the subject sense amplifier bank (i.e., the sense amplifier bank within the sub-column-address-selected memory cell mat) to drive data signals onto and receive data from the column data I/O lines 427—delivering read data from the sense amplifiers 421 to the data I/O interface and enabling write data from the data I/O interface to overwrite the contents of the sense amplifiers 21 (and drive that data back to the activated row of memory cells 403).

Figure 9:
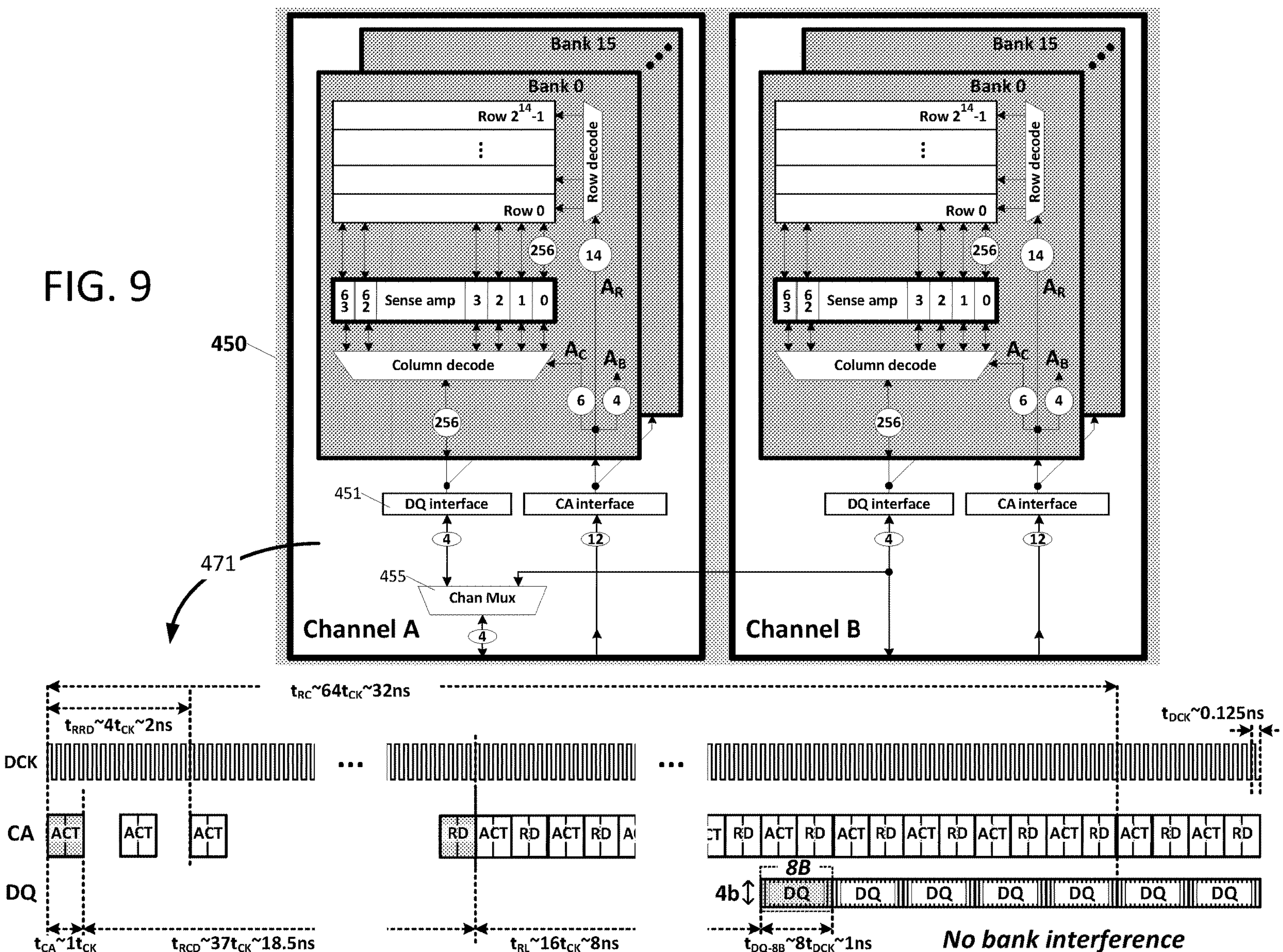
FIG. 9 illustrates an alternative embodiment of a dual-channel, variable-granularity memory component having circuitry to support merged-bank operation.

FIG. 9 illustrates an alternative embodiment of a dual-channel, variable-granularity memory component 450 having circuitry to support merged-bank operation. As in the FIG. 1 embodiment, each of memory channels A and B includes 15 memory banks organized in row and columns (with like-dimensioned row and column counts shown for example) together with data and command/address signaling interfaces. To simplify explanation of bank-merged operation, the data interface 451 within each channel (A and B) is shown as having a 4-bit data width according to resolution mode access—additional I/O circuitry sufficient to support volume-mode data transfer (e.g., 16-bits per channel) may present within each data interface.

Still referring to FIG. 9, a channel multiplexer 455 is provided in one or both memory channels (shown in channel A only in the depicted embodiment) to enable read/write data conveyed via an external data path coupled to channel A to be routed to/from either of the channel A/channel B data interfaces—in effect enabling access to each of the two memory channels via a single data interface 451 and thus effecting a logical merger of the two 16-bank memory channels into a single 32-bank memory channel. In one embodiment such "bank-merged" operation is enabled by programmed setting (e.g., as discussed in reference to FIG. 5) so that the two memory channels may be operated in bank-merged mode or independently (in which case channel multiplexer 455 statically passes data between external data links and the channel-A data interface). In other embodiments, bank-merged operation may be selected on the fly, for example, through command specification (i.e., command code indicates whether a given transaction or sequence of transactions is to be executed in bank-merged mode). In any case, an additional bank-address bit may be provided within incoming command/address packets (e.g., widening the CA path to 12 bits if necessary to accommodate the additional address bit) to support bank-merged operation—that additional bit selecting between the sixteen banks of channel A or the sixteen banks of channel B while the remaining four bank address bits are decoded within a given channel to carry out row activation and column access operations. The added bank-address bit, referred to herein as the channel-select bit, is also supplied to the channel multiplexer to route data to/from the selected memory channel during column access operations.

In one embodiment, replicated command/address packets are transmitted simultaneously to the CA interfaces within each of the two memory channels with inverted channel-select bits thus enabling the commanded transaction (e.g., row activation or column read or write) within one memory channel or the other. In alternative embodiments, the two channel interfaces may be switchably coupled together during bank-merged operation and a bank-merge enable bit (e.g., within programmable register or command conveyance) may flip the state of the channel-select signal sent to the channel-B command/address interface, thus enabling one channel or the other to respond to an otherwise shared command.

In one embodiment, shown in timing detail 471 of FIG. 9, memory component 450 is subject to the 32nS row cycle constraint discussed above and operates at the same system and data clock rates (i.e., 2 GHz system clock, 8 GHz data clock). Assuming a 4-bit resolution-mode data interface width, each resolution-mode column access command is followed by a corresponding 8-byte read or write data burst (4 bits over 16 $t_{BIT}$ intervals and thus 8 DCK cycles or two CK cycles). When bank-merged operation is enabled, doubling the number of banks accessible via a given memory channel from 16 to 32, peak data throughput may be achieved (i.e., no idle time on data path) with a single 8B column access per row activation in each of the 32 banks—avoiding the need for multiple column access operations per row activation and thus further reducing access granularity (8B per row activation instead of 16B) and increasing access efficiency (e.g., lowering the access-energy/bit).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit memory component comprising:

a first data interface to transmit up to N bit-serial data signals in parallel via N external signaling links;

control circuitry to:

receive, as part of a first memory read transaction to be executed during a first interval over which the integrated-circuit memory component remains continuously operable, a first column read command having a first command code that specifies a first volume of data;

enable the first data interface, in response to the first column read command, to transmit the first volume of data as N parallel bit-serial data signals over the N external signaling links;

receive, as part of a second memory read transaction to be executed during the first interval, a second column read command having a second command code that is different from the first command code and specifies a second volume of data constituted by not more than half as many data bits as the first volume of data; and enable the first data interface, in response to the second column read command, to transmit the second volume of data as M parallel bit-serial data signals over M of the N external signaling links, where M is less than N.

2. The integrated-circuit memory component of claim 1 wherein the first volume of data is constituted by a first quantity (Q1) of bits and the second volume of data is constituted by a second quantity (Q2) of bits, where Q2=Q1/(N/M), where '/' denotes division.

3. The integrated-circuit memory component of claim 1 further comprising a sense amplifier bank, and wherein the control circuitry to receive the first and second column read commands comprises a command/address interface to:

receive, as part of the first column read command, first column address value that uniquely identifies a location of the first volume of data within the sense amplifier bank, and receive, as part of the second column read command, a second column address value that uniquely identifies a location of the second volume of data within the sense amplifier bank, the second column address value having more constituent bits than the first column address value.

4. The integrated-circuit memory component of claim 3 wherein the second column address comprises $\log_2(N/M)$ more bits than the first column address.

5. The integrated-circuit memory component of claim 3 wherein the first and second command codes differ from one another in the state of one or more constituent bits.

6. The integrated-circuit memory component of claim 5 wherein the state of the one or more constituent bits within the second command code indicates that the second column address is to have more bits than would be indicated by a different state of the one or more constituent bits within the second command code.

7. The integrated-circuit memory component of claim 1 further comprising a second data interface to transmit up to N bit-serial data signals in parallel via N external signaling links that are distinct from the N external signaling links onto which the first data interface transmits up to N bit-serial data signals.

8. The integrated-circuit memory component of claim 1 wherein the control circuitry to receive the first and second column commands and to enable the first data interface to transmit the first and second volumes of data comprises first command/address circuitry, the integrated-circuit component further comprising second command/address circuitry to:

receive, as part of a third memory read transaction, a third column read command having that identifies a third volume of data;

enable a second data interface, in response to the third column read command, to transmit the third volume of data as N parallel bit-serial data signals over N external signaling links to which the second data interface is to be coupled; and receive, as part of a fourth memory read transaction, a fourth column read command that identifies a fourth volume of data, the fourth volume of data being constituted by not more than half as many data bits as the third volume of data; and enable the second data interface, in response to the fourth column read command, to transmit the fourth volume of data as M parallel bit-serial data signals over the N external signaling links to which the second data interface is to be coupled.

9. The integrated-circuit memory component of claim 8 further comprising first and second core storage arrays each organized as a respective plurality of memory banks, and wherein the first command/address circuitry comprises circuitry to retrieve the first and second volumes of data from the first core storage array as part of the first and second memory read transactions, respectively, and the second command/address circuitry comprises circuitry to retrieve the third and fourth volumes of data from the second core storage array as part of the third and fourth memory read transactions, respectively.

10. The integrated-circuit memory component of claim 9 further comprising multiplexing circuitry coupled to the first and second data interfaces and wherein the control circuitry is further to:

receive, as part of a fifth memory read transaction, a fifth column read command that identifies a fifth volume of data within either of the first or second core storage arrays; and enable the first data interface, in response to the fifth column read command, to transmit the fifth volume of data as a plurality of parallel bit-serial data signals over a plurality of the N external signaling links to be coupled to the first data interface.

11. A method of operation within an integrated-circuit memory component, the method comprising:

receiving, as part of a first memory read transaction executed during a first interval over which the integrated circuit memory component remains continuously operable, a first column read command having a first command code that specifies a first volume of data;

in response to receiving the first column read command, enabling a first data interface to transmit the first volume of data as N parallel bit-serial data signals over N external signaling links; and receiving, as part of a second memory read transaction executed during the first interval, a second column read command having a second command code that is different from the first command code and specifies a second volume of data constituted by not more than half as many data bits as the first volume of data; and in response to receiving the second column read command, enabling the first data interface to transmit the second volume of data as M parallel bit-serial data signals over M of the N external signaling links, where M is less than N.

12. The method of claim 11 wherein the first volume of data is constituted by a first quantity (Q1) of bits and the second volume of data is constituted by a second quantity (Q2) of bits, where Q2=Q1/(N/M), where '/' denotes division.

13. The method of claim 11 wherein & receiving the first and second column read commands comprises:

receiving, as part of the first column read command, a first column address value that uniquely identifies a location of the first volume of data within a sense amplifier bank of the integrated circuit memory component; and receiving, as part of the second column read command, a second column address value that uniquely identifies a location of the second volume of data within the sense amplifier bank, the second column address value having more constituent bits than the first column address value.

14. The method of claim 13 wherein the second column address comprises $\log_2(N/M)$ more bits than the first column address.

15. The method of claim 13 wherein the first and second command codes differ from one another in the state of one or more constituent bits.

16. The method of claim 15 wherein the state of the one or more constituent bits within the second command code indicates that the second column address is to have more bits than would be indicated by a different state of the one or more constituent bits within the second command code.

17. The method of claim 11 further comprising enabling a second data interface to transmit, as part of a third memory access transaction, up to N bit-serial data signals in parallel via N external signaling links that are distinct from the N external signaling links on which the first and second volumes of data are transmitted.

18. The method of claim 11 further comprising:

receiving, as part of a third memory read transaction, a third column read command that identifies a third volume of data;

in response to the third column read command, enabling a second data interface to transmit the third volume of data as N parallel bit-serial data signals over N external signaling links to which the second data interface is coupled; and receiving, as part of a fourth memory read transaction, a fourth column read command that identifies a fourth volume of data, the fourth volume of data being constituted by not more than half as many data bits as the third volume of data; and in response to the fourth column read command, enabling the second data interface, to transmit the fourth volume of data as M parallel bit-serial data signals over M of the N external signaling links to which the second data interface is to be coupled.

19. The method of claim 18 further comprising retrieving the first and second volumes of data from a first core storage array as part of the first and second memory read transactions, respectively, and retrieving the third and fourth volumes of data from a second core storage array as part of the third and fourth memory read transactions, respectively.

20. The method of claim 19 further comprising:

receiving, as part of a fifth memory read transaction, a fifth column read command that identifies a fifth volume of data within either of the first or second core storage arrays; and in response to the fifth column read command, enabling the first data interface to transmit the fifth volume of data as a plurality of parallel bit-serial data signals over a plurality of the N external signaling links coupled to the first data interface.

21. An integrated-circuit memory component comprising:

a data storage;

means for receiving, as part of a first memory read transaction executed during a first interval over which the integrated circuit memory component remains continuously operable, a first column read command having a first command code that specifies a first volume of data within the data storage and for receiving, as part of a second memory read transaction executed during the first interval, a second column read command having a second command code that is different from the first command code and specifies a second volume of data within the data storage, the second volume of data constituted by not more than half as many data bits as the first volume of data; and means for transmitting the first volume of data as N parallel bit-serial data signals over N external signaling links in response to the first column read command, and for transmitting the second volume of data as M parallel bit-serial data signals over M of the N external signaling links in response to the second column read command, where M is less than N.

* * * * *